US007420265B2

(12) United States Patent
Bathan et al.

(10) Patent No.: US 7,420,265 B2
(45) Date of Patent: Sep. 2, 2008

(54) INTEGRATED CIRCUIT PACKAGE SYSTEM WITH INTEGRATED CIRCUIT SUPPORT

(75) Inventors: Henry D. Bathan, Singapore (SG); Il Kwon Shim, Singapore (SG); Jeffrey D. Punzalan, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 344 days.

(21) Appl. No.: 11/164,321

(22) Filed: Nov. 17, 2005

(65) Prior Publication Data

US 2007/0108559 A1 May 17, 2007

(51) Int. Cl.
*H01L 23/495* (2006.01)

(52) U.S. Cl. ....................... 257/666; 257/670; 257/674; 257/778; 257/783; 257/E23.031; 257/E23.037; 257/E23.04; 257/E23.043

(58) Field of Classification Search ......... 257/666–677, 257/778, 783, E23.031–E23.059
See application file for complete search history.

(56) References Cited

U.S. PATENT DOCUMENTS

| | | | | |
|---|---|---|---|---|
| 6,342,443 | B1 | 1/2002 | Tao et al. | 438/614 |
| 6,429,046 | B1 | 8/2002 | Marlin | 438/108 |
| 6,507,121 | B2 | 1/2003 | Huang | 257/780 |
| 6,781,245 | B2 | 8/2004 | Huang | 257/780 |
| 6,787,921 | B2 | 9/2004 | Huang | 257/778 |
| 6,864,423 | B2 * | 3/2005 | Tan et al. | 174/536 |
| 2007/0099348 | A1 * | 5/2007 | Sharma et al. | 438/123 |

* cited by examiner

*Primary Examiner*—Jasmine J Clark
(74) *Attorney, Agent, or Firm*—Mikio Ishimaru

(57) ABSTRACT

An integrated circuit package system including an integrated circuit die, a leadframe and an integrated circuit support. The integrated circuit support between the integrated circuit die and the leadframe with the electrical interconnects connected to the leadframe.

6 Claims, 4 Drawing Sheets

INTEGRATED CIRCUIT PACKAGE SYSTEM WITH INTEGRATED CIRCUIT SUPPORT

TECHNICAL FIELD

The present invention relates generally to integrated circuit package systems, and more particularly to a system for an integrated circuit spacer package.

BACKGROUND ART

An integrated circuit die is a small device formed on a semiconductor wafer, such as a silicon wafer. Such an integrated circuit die is typically singulated from the wafer and attached to a substrate or base carrier for redistribution of electrical interconnects. Bond pads on the integrated circuit die are then electrically connected to the leads on the leadframe via wire bonding or solder bumps. The integrated circuit die and the leadframe are encapsulated with a protective material such that a package is formed. The leads encapsulated in the package are redistributed in a network of conductors within the carrier and end in an array of terminal points outside the package. The terminal points allow the integrated circuit die to be electrically connected with other circuits, such as on a printed circuit board.

Modern consumer electronics particularly personal portable devices, such as cell phones, digital cameras, music players, PDA's, and location-based devices, require miniaturization as well as increasing integrated circuit die content to fit an ever shrinking physical space. Numerous technologies have been developed to meet these requirements. Some of these technologies involve flip chip integrated circuit die in integrated circuit packages. The demand for flip chip packages for integrated circuit die applications is increasing. These technologies have struggled with manufacturing and fabrication problems including the attachment of the integrated circuit die and its electrical connection. Other problems include stresses, fatigue, delamination and contamination often resulting in damage to the integrated circuit die. This damage causes failures that are sometimes intermittent and hard to detect or analyze. Broad use of flip chip integrated circuit die has extended the needs for reliability and performance beyond even recent expectations.

With the continual miniaturization of electronic components and overall systems, the solder bump becomes smaller as well. This reduction in the size of the solder bump places increasing demands on the mechanical properties of the solder to ensure joint robustness. In addition to footprint reduction, there is an emphasis on total space reduction, often leading to reduced size in the packaging of the silicon die. As surface mount technology migrates toward smaller package dimensions, the physical and thermal characteristics of each packaging material become more critical. Differences between materials within a package from layer to layer or between the leadframe and the die can cause internal stresses also placing demands on the packaging materials.

Thus a need still remains for an integrated circuit package system to ensure that the manufacturing methods provide increasing reliability and performance. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including an integrated circuit die, a leadframe and an integrated circuit support. The integrated circuit support between the integrated circuit die and the leadframe with the electrical interconnects connected to the leadframe.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
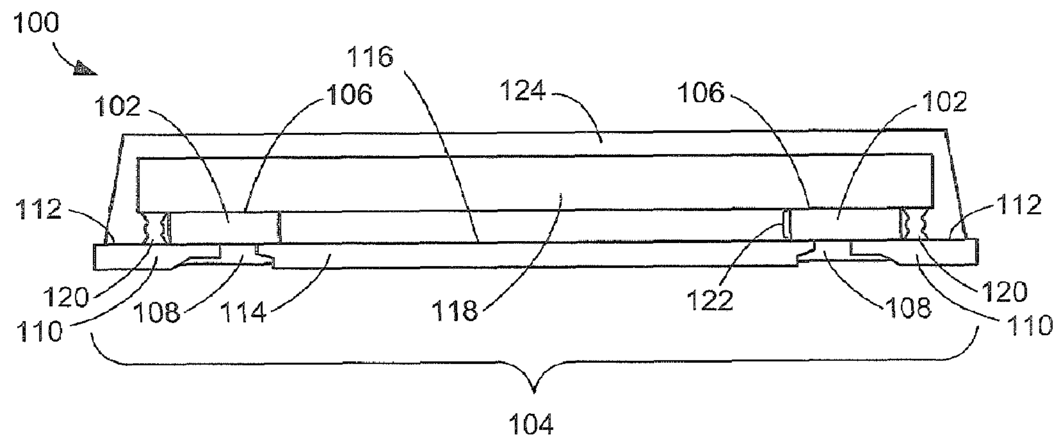
FIG. 1 is a cross-sectional view of an integrated circuit package system having a ring-shaped integrated circuit support in accordance with an embodiment of the present invention.

In the following description, numerous specific details are given to provide a thorough understanding of the invention. However, it will be apparent that the invention may be practiced without these specific details. In order to avoid obscuring the present invention, some well-known circuits, package configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the apparatus/device as oriented downward, this arrangement in the FIGs. is arbitrary and is not intended to suggest that the apparatus/device should necessarily be attached in a downward direction. Generally, the device can be operated in any orientation. The same numbers are used in all the drawing FIGs. to relate to the same elements.

The term "horizontal" as used herein is defined as a plane parallel to the conventional plane or surface of the leadframe, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 having a ring-shaped integrated circuit support 102 in an embodiment of the present invention. The ring-shaped integrated circuit support 102 is between an integrated circuit die 118 and a leadframe 104, preferably close to electrical interconnects 120. The ring-shaped integrated circuit support 102 provides a support top surface 106 and a support bottom surface 108. The ring-shaped integrated circuit support 102 is formed of a non-conductive material having high thermal characteristics that can withstand process temperatures.

For illustrative purposes, the ring-shaped integrated circuit support 102 is shown in a configuration in the form of a ring-shape, although it is understood that other configurations may be used. Further, it is understood that different methods, processes, or materials may be used such as a laminate, a B-stage (partially cured) printed film, a polyimide adhesive film, a printed circuit board material laminate, an epoxy acrylate, an elastomer, an adhesive film, or a film adhesive.

The leadframe 104 includes terminals 110, terminal top surfaces 112, a paddle 114 and a paddle top surface 116. The integrated circuit die 118 is a flip chip and is electrically connected to the terminal top surfaces 112 by the electrical interconnects 120. For illustrative purposes, the leadframe 104 is shown as a leadframe in a quad flat non-leaded (QFN) package, although it is understood that other materials, methods or processes may be used. For illustrative purposes, the electrical interconnects 120 are shown as solder bumps, although it is understood that other electrical connection materials, methods, or processes may be used. Further, it is understood that any number of the electrical interconnects 120 may be used.

The ring-shaped integrated circuit support 102 provides uniform support and spacing between the leadframe 104 and the integrated circuit die 118. The support top surface 106 is attached to the integrated circuit die 118 and the support bottom surface 108 is attached to the leadframe 104. The ring-shaped integrated circuit support 102 is designed with a height 122 predetermined to provide spacing for electrically connecting the electrical interconnects 120 to the integrated circuit die 118 and the terminal top surfaces 112. The height 122 prevents excessive solder bump collapse, which is defined as a collapse that results in open or high resistance circuits, during solder reflow of the electrical interconnects 120.

The elastic and/or softness material properties of the ring-shaped integrated circuit support 102 may need to vary in a wide range. For the application to work, the ring-shaped integrated circuit support 102 in its raw form (before final curing) may generally need to be soft, pliant, compressible and formable upon placement of the integrated circuit die 118. This is so that contact of the electrical interconnects 120 with the terminal top surfaces 112 can be ensured. The ring-shaped integrated circuit support 102 may be curable (meaning, it may be softer and more tacky during the attach process, and final hardening may be achieved by curing).

For illustrative purposes the ring-shaped integrated circuit support 102 is shown as a homogenous material, although it is understood that the ring-shaped integrated circuit support 102 may be a compound, layered or other materials. Further, it is understood that the ring-shaped integrated circuit support 102 may be a tape or include other attachment materials, methods or processes.

An encapsulant 124 is molded around the integrated circuit die 118.

Figure 2:
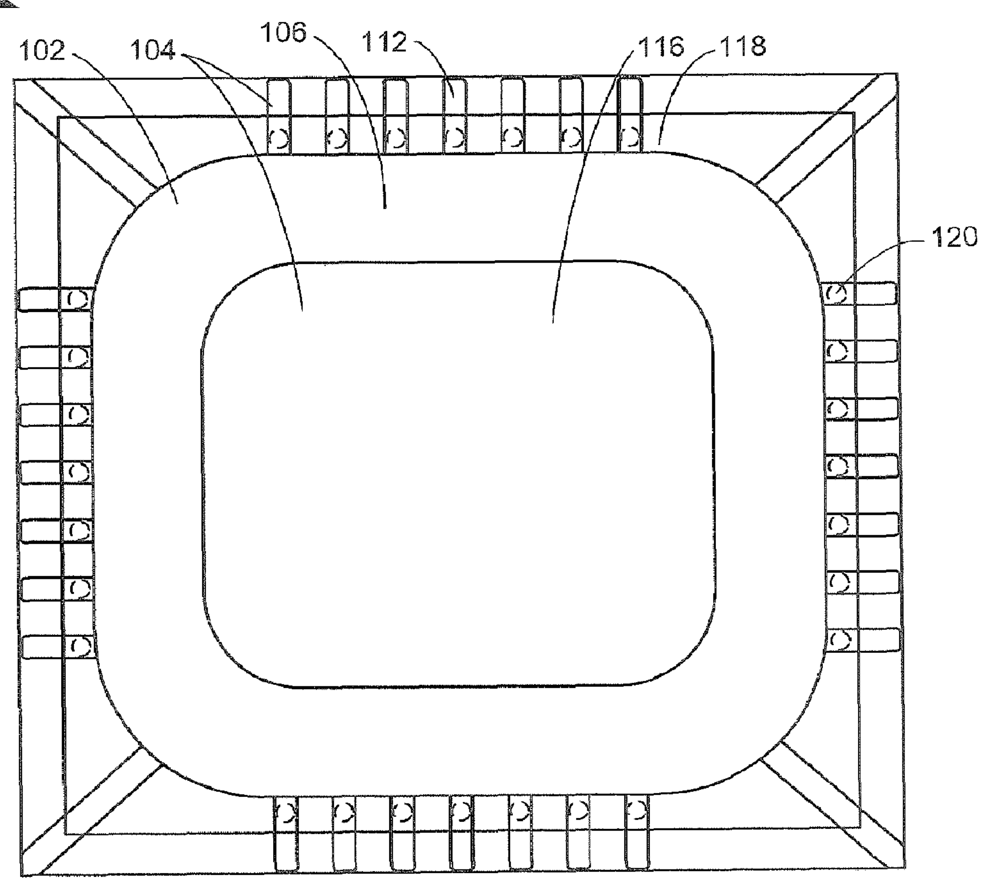
FIG. 2 is a top view of the structure of FIG. 1.

Referring now to FIG. 2, therein is shown a top view of the structure of FIG. 1. The integrated circuit die 118 overlaps the ring-shaped integrated circuit support 102. The overlapping area provides an attachment surface for the integrated circuit die 118 and the support top surface 106. The ring-shaped integrated circuit support 102 partially overlaps both the terminal top surfaces 112 and the paddle top surface 116. The overlapping areas provide an attachment surface for the ring-shaped integrated circuit support 102 and the leadframe 104. The terminal top surfaces 112 and the paddle top surface 116 are exposed in non-overlapping areas. The exposed areas of the terminal top surfaces 112 provide attachment surfaces for the electrical interconnects 120.

For illustrative purposes, the ring-shaped integrated circuit support 102 is shown in a configuration in the form of a ring, although it is understood that other configurations may be used. Further, it is understood that other materials, methods or processes may be used.

Figure 3:
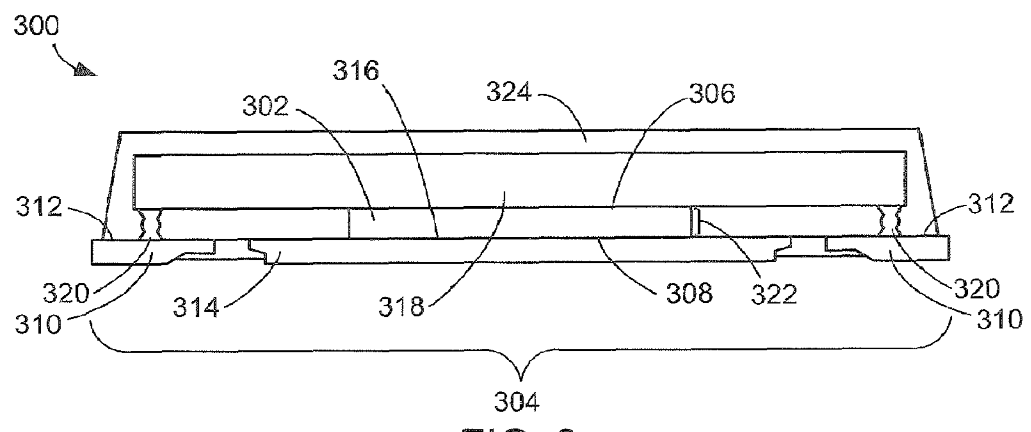
FIG. 3 is a cross-sectional view of an integrated circuit package system having a smaller-than-paddle integrated circuit support in accordance with an alternative embodiment.

Referring now to FIG. 3, therein is shown a cross-sectional view of an integrated circuit package system 300 having a smaller-than-paddle integrated circuit support 302 in an alternative embodiment of the present invention. The smaller-than-paddle integrated circuit support 302 is between an integrated circuit die 318 and a leadframe 304. The smaller-than-paddle integrated circuit support 302 provides a support top surface 306 and a support bottom surface 308. The smaller-than-paddle integrated circuit support 302 is formed of a non-conductive material having high thermal characteristics that can withstand process temperatures.

For illustrative purposes, the smaller-than-paddle integrated circuit support 302 is shown in a configuration in the form of a rectangle smaller than the paddle 314, although it is understood that other configurations may be used. Further, it is understood that different methods, processes, or materials may be used such as a laminate, a B-stage (partially cured) printed film, a polyimide adhesive film, a printed circuit board material laminate, an epoxy acrylate, an elastomer, an adhesive film, or a film adhesive.

The leadframe 304 includes terminals 310, terminal top surfaces 312, the paddle 314 and a paddle top surface 316. The integrated circuit die 318 is flip chip and is electrically connected to the terminal top surfaces 312 by electrical interconnects 320. For illustrative purposes, the leadframe 304 is shown as a leadframe in a quad flat non-leaded (QFN) package, although it is understood that other materials, methods, or processes may be used. For illustrative purposes, the electrical interconnects 320 are shown as solder bumps, although it is understood that other electrical connection materials, methods or processes may be used. Further, it is understood that any number of the electrical interconnects 320 may be used.

The smaller-than-paddle integrated circuit support 302 provides uniform support and spacing between the leadframe 304 and the integrated circuit die 318. The support top surface 306 is attached to the integrated circuit die 318 and the support bottom surface 308 is attached to the leadframe 304. The smaller-than-paddle integrated circuit support 302 is designed with a height 322 predetermined to provide spacing for electrically connecting the electrical interconnects 320 to the integrated circuit die 318 and the terminal top surfaces 312. The height 322 prevents excessive solder bump collapse during solder reflow of the electrical interconnects 320.

The elastic and/or softness material properties of the smaller-than-paddle integrated circuit support 302 may need to vary in a wide range. For the said application to work, the smaller-than-paddle integrated circuit support 302 in its raw form (before final curing) may generally need to be soft, pliant, compressible and formable upon placement of the integrated circuit die 318. This is so that contact of electrical interconnects 320 with the terminal top surfaces 312 can be ensured. The smaller-than-paddle integrated circuit support 302 may be curable (meaning, it may be softer and more tacky during the attach process, and final hardening may be achieved by curing).

For illustrative purposes, the smaller-than-paddle integrated circuit support 302 is shown as a homogenous material, although it is understood that the smaller-than-paddle integrated circuit support 302 may be a compound, layered or other materials. Further, it is understood that the smaller-than-paddle integrated circuit support 302 may be a tape or include other attachment materials, methods or processes.

An encapsulant 324 is molded around the integrated circuit die 318.

Figure 4:
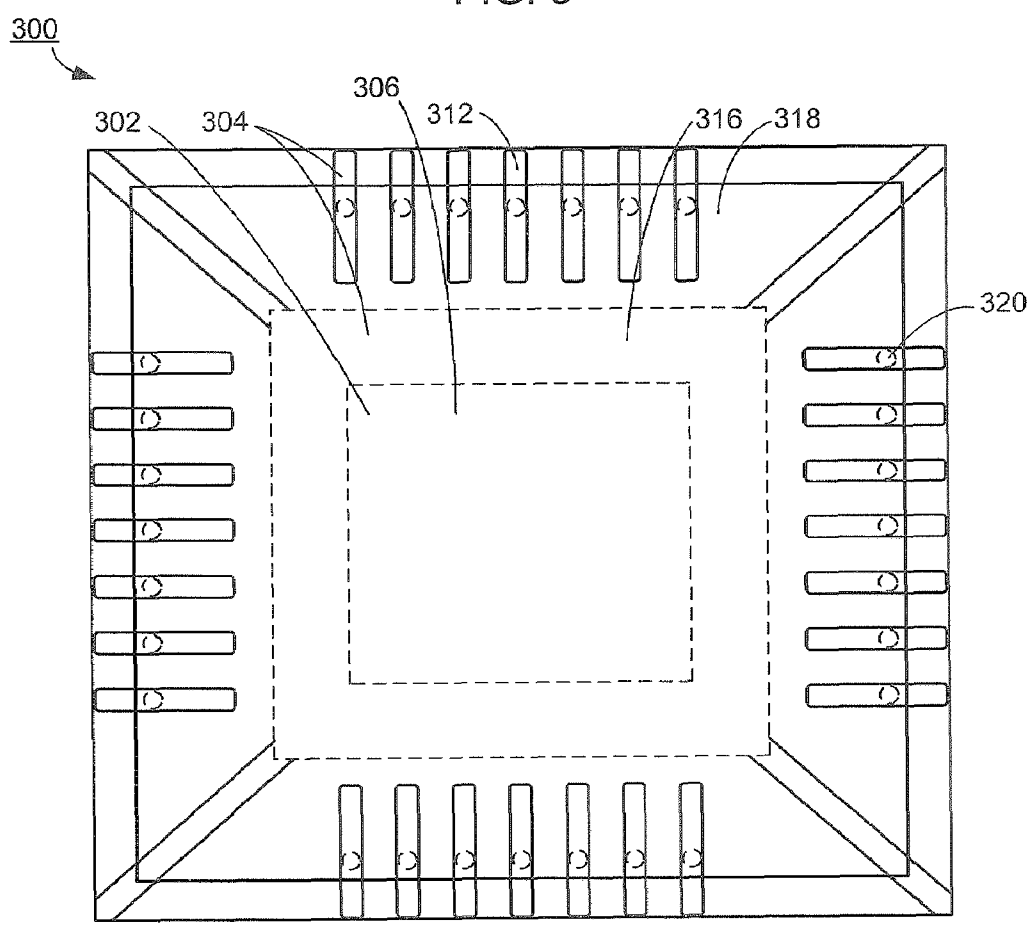
FIG. 4 is a top view of the structure of FIG. 3.

Referring now to FIG. 4, therein is shown a top view of the structure of FIG. 3. The integrated circuit die 318 overlaps the smaller-than-paddle integrated circuit support 302. The overlapping area provides an attachment surface for the integrated circuit die 318 and the support top surface 306. The smaller-than-paddle integrated circuit support 302 partially overlaps the paddle top surface 316. The overlapping area provides an attachment surface for the smaller-than-paddle integrated circuit support 302 and the leadframe 304. The terminal top surfaces 312 and the paddle top surface 316 are exposed in non-overlapping areas. The exposed areas of the terminal top surfaces 312 provide attachment surfaces for the electrical interconnects 320.

For illustrative purposes, the smaller-than-paddle integrated circuit support 302 is shown in a configuration in the form of a rectangle-shape, although it is understood that other configurations may be used. Further, it is understood that other materials, methods or processes may be used.

Figure 5:
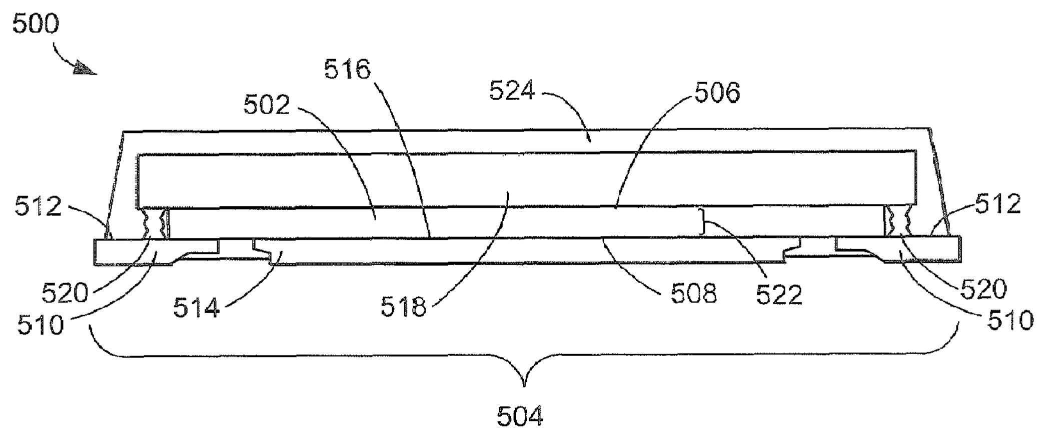
FIG. 5 is a cross-sectional view of an integrated circuit package system having a larger-than-paddle integrated circuit support in accordance with yet another embodiment of the present invention.

Referring now to FIG. 5, therein is shown a cross-sectional view of an integrated circuit package system 500 with a larger-than-paddle integrated circuit support 502 in yet another embodiment of the present invention. The larger-than-paddle integrated circuit support 502 is between the integrated circuit die 118 and a leadframe 504, preferably close to electrical interconnects 520. The larger-than-paddle integrated circuit support 502 provides a support top surface 506 and a support bottom surface 508. The larger-than-paddle integrated circuit support 502 is formed of a non-conductive material having high thermal characteristics that can withstand process temperatures.

For illustrative purposes, the larger-than-paddle integrated circuit support 502 is shown in a configuration in the form of a rectangle, although it is understood that other configurations may be used. Further, it is understood that different methods, processes, or materials may be used such as a laminate, a B-stage (partially cured) printed film, a polyimide adhesive film, a printed circuit board material laminate, an epoxy acrylate, an elastomer, an adhesive film, or a film adhesive.

The leadframe 504 includes terminals 510, terminal top surfaces 512, a paddle 514 and a paddle top surface 516. An integrated circuit die 518 is a flip chip and is electrically connected to the terminal top surfaces 512 by the electrical interconnects 520. For illustrative purposes, the leadframe 504 is shown as a leadframe in a quad flat non-leaded (QFN) package, although it is understood that other materials, methods or processes may be used. For illustrative purposes, the electrical interconnects 520 are shown as solder bumps, although it is understood that other electrical connection materials, methods or processes may be used. Further, it is understood that any number of the electrical interconnects 520 may be used.

The larger-than-paddle integrated circuit support 502 provides uniform support and spacing between the leadframe 504 and the integrated circuit die 518. The support top surface 506 is attached to the integrated circuit die 518 and the support bottom surface 508 is attached to the leadframe 504. The larger-than-paddle integrated circuit support 502 is designed with a height 522 predetermined to provide spacing for electrically connecting the electrical interconnects 520 to the integrated circuit die 518 and the terminal top surfaces 512 and to prevent collapse of the electrical interconnects 520. The height 522 prevents excessive solder bump collapse during solder reflow of the electrical interconnects 520.

The elastic and/or softness material properties of the larger-than-paddle integrated circuit support 502 may need to vary in a wide range. For the said application to work, the larger-than-paddle integrated circuit support 502 in its raw form (before final curing) may generally need to be soft, pliant, compressible and formable upon placement of the integrated circuit die 518. This is so that contact of the electrical interconnects 520 with the terminal top surfaces 512 can be ensured. The larger-than-paddle integrated circuit support 502 may be curable (meaning, it may be softer and more tacky during the attach process, and final hardening may be achieved by curing).

For illustrative purposes, the larger-than-paddle integrated circuit support 502 is shown as a homogenous material, although it is understood that the larger-than-paddle integrated circuit support 502 may be a compound, layered or other materials. Further, it is understood that the larger-than-paddle integrated circuit support 502 may be a tape or include other attachment materials, methods or processes.

An encapsulant 524 is molded around the integrated circuit die 518.

Figure 6:
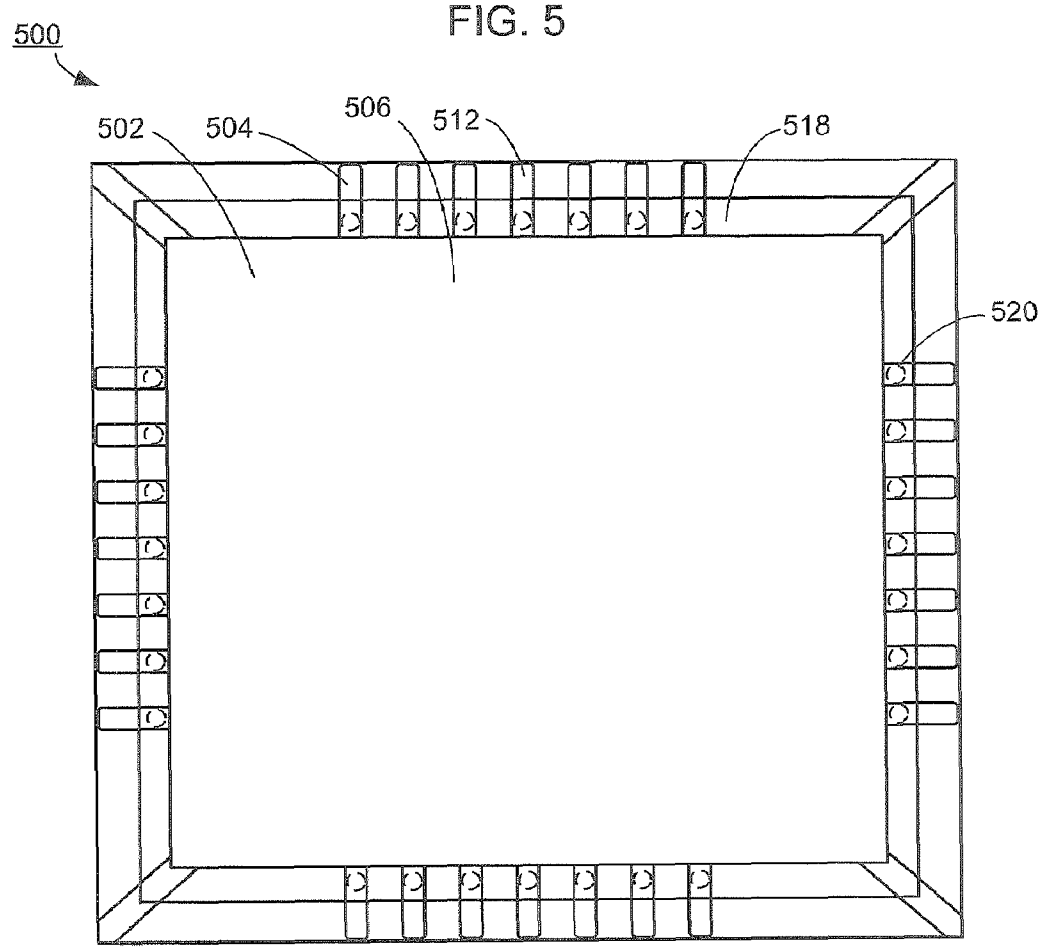
FIG. 6 is a top view of the structure of FIG. 5.

Referring now to FIG. 6, therein is shown a top view of the structure of FIG. 5. The integrated circuit die 518 overlaps the larger-than-paddle integrated circuit support 502. The overlapping area provides an attachment surface for the integrated circuit die 518 and the support top surface 506. The larger-than-paddle integrated circuit support 502 partially overlaps the terminal top surfaces 512 and completely overlaps the paddle top surface 516 (not shown). The overlapping area provides an attachment surface for the larger-than-paddle integrated circuit support 502 and the leadframe 504. The terminal top surfaces 512 are exposed in non-overlapping areas. The exposed areas of the terminal top surfaces 512 provide attachment surfaces for the electrical interconnects 520.

For illustrative purposes, the larger-than-paddle integrated circuit support 502 is shown in a configuration in the form of a rectangle-shape, although it is understood that other configurations may be used. Further, it is understood that other materials, methods or processes may be used.

Figure 7:
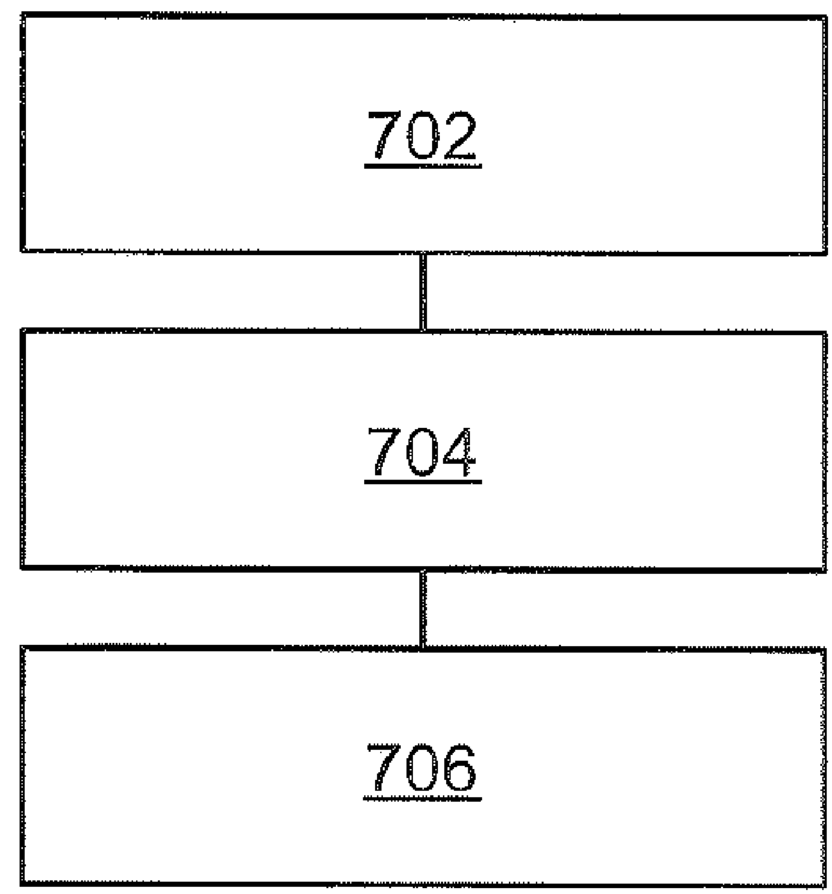
FIG. 7 is a flow chart of a system for an integrated circuit package with integrated circuit support in an embodiment of the present invention of the present invention.

Referring now to FIG. 7, therein is shown a flow chart of a system 700 for an integrated circuit package with integrated circuit support in an embodiment of the present invention. The system 700 includes providing an integrated circuit die with electrical interconnects in a block 702; providing a leadframe in a block 704; and forming an integrated circuit support between the integrated circuit die and the leadframe with the electrical interconnects connected to the leadframe in a block 706.

In greater detail, a method to fabricate the integrated circuit package system 100, according to an embodiment of the present invention, is performed as follows:

(1) 1. The integrated circuit die 118 is a very large-scale integrated circuit that may have a large planar dimension. (FIG. 1)

(2) 2. The leadframe 104 is used in a quad leadless package (QLP) and may support a large number of the electrical interconnects 120. (FIG. 1)

(3) 3. The integrated circuit support 102 is formed having high thermal characteristics that can withstand process temperatures. (FIG. 1)

(4) 4. The integrated circuit support 102 is designed with a height 122 predetermined to provide spacing for the electrical interconnects 120. (FIG. 1)

(5) 5. The support top surface 106 is attached to the integrated circuit die 118 and the support bottom surface 108 is attached to the leadframe 104. (FIG. 1)

It has been discovered that the present invention thus has numerous advantages.

An advantage is that the present invention improves the integrated circuit electrical package reliability and performance. Reliability and performance improvements include better control in fabrication, simplified manufacturing and higher product yield. Improving the reliability and performance results in a reduction of manufacturing scrap and more importantly a reduction in failures after integration into higher-level systems, particularly those released or in the field.

It has been discovered that the disclosed structure provides improved regulation of solder wetting. The improved regulation of solder wetting provides a uniform contact area and consequently consistent electrical interconnection. As electrical interconnects increase in number and decrease in size, the need for uniformity and consistency become more acute. Providing extrinsic support without relying on mass and area ratios allows additional flexibility with components and materials.

It has also been discovered that the disclosed structure improves the collapse height of solder bumps. The collapse height not only affects uniformity and consistency, but also provides improved planarity. Improved planarity mitigates electrical interconnect stress, leadframe delamination, mounting fatigue, encapsulant non-conformance, and component contamination. Alternatively, improved planarity benefits electrical connectivity, mechanical integrity, encapsulant conformance and package reliability.

Yet another discovery of the disclosed structure is the elimination of solder contamination on the outer lead surface. The elimination of solder contamination on the outer lead surface provides several benefits including, improved electrical connectivity, reduced corrosion, consistent PCB mounting, and improved yields. These benefits extend beyond fabrication methods and manufacturing processes to the implementation of the disclosed structure in systems and products.

Yet another discovery of the disclosed structure is the elimination of solder bridging. And yet again the disclosed structure provides broad benefits. Beyond the fabrication and manufacturing yields, the elimination of solder bridging provides protection against intermittent or collateral failures. These intermittent or collateral failures are particularly costly and time intensive to analyze and remedy. These failures rapidly multiply costs and time at each successive level of integration.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional advantages for integrated circuit packages. The resulting processes and configurations are straightforward, cost-effective, uncomplicated, highly versatile and effective, can be implemented by adapting known technologies, and are thus readily suited for efficiently and economically manufacturing integrated circuit package devices. The resulting processes and configurations are straightforward, cost-effective, uncomplicated, highly versatile, accurate, sensitive, and effective, and can be implemented by adapting known components for ready, efficient, and economical manufacturing, application, and utilization.

The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:

providing an integrated circuit die with solder bumps;

providing a leadframe;

forming an integrated circuit support with a predetermined height to provide spacing for electrically connecting solder bumps to the integrated circuit die and the leadframe and to prevent excessive collapse of the solder wherein forming the integrated circuit support comprises a configuration in the form of a rectangle-shape overlapping a paddle of the leadframe and terminals of the leadframe; and attaching the integrated circuit support between the integrated circuit die and the leadframe, providing planarity and solder bumps integrity.

2. The system as claimed in claim 1 wherein the integrated circuit support comprises a non-conductive material providing structural support and high thermal characteristics that can withstand process temperatures for forming a set of solder bumps.

3. An integrated circuit package system comprising:

providing an integrated circuit die with solder bumps;

providing a leadframe;

forming an integrated circuit support with a predetermined height to provide spacing for electrically connecting solder bumps to the integrated circuit die and the leadframe and to prevent excessive collapse of the solder wherein forming the integrated circuit support comprises a configuration in the form of a ring-shape overlapping a paddle of the leadframe and terminals of the leadframe; and attaching the integrated circuit support between the integrated circuit die and the leadframe, providing planarity and solder bumps integrity.

4. An integrated circuit package system comprising:

an integrated circuit die;

a leadframe; and an integrated circuit support with a predetermined height to provide spacing for electrically connecting solder bumps to the integrated circuit die and the leadframe and to prevent excessive collapse, the integrated circuit support is attached between the integrated circuit die and the leadframe providing planarity and solder bumps wherein the integrated circuit support comprises a configuration in the form of a rectangle-shape overlapping a paddle of the leadframe and terminals of the leadframe.

5. The system as claimed in claim 4 wherein the integrated circuit support comprises a non-conductive adhesive material providing both structural support and adhesion with the supported die's backside.

6. An integrated circuit package system comprising:

an integrated circuit die;

a leadframe; and an integrated circuit support with a predetermined height to provide spacing for electrically connecting solder bumps to the integrated circuit die and the leadframe and to prevent excessive collapse, the integrated circuit support is attached between the integrated circuit die and the leadframe providing planarity and solder bumps wherein the integrated circuit support comprises a configuration in the form of a ring-shape overlapping a paddle of the leadframe and terminals of the leadframe.

* * * * *